US006678408B1

(12) United States Patent
Ruggiero et al.

(10) Patent No.: US 6,678,408 B1
(45) Date of Patent: Jan. 13, 2004

(54) NOISE REDUCTION THROUGH COMPARATIVE HISTOGRAMS

(75) Inventors: Carl J. Ruggiero, Sherwood, OR (US); Alan Lasneski, Turner, OR (US)

(73) Assignee: InFocus Corporation, Wilsonville, OR (US)

( * ) Notice: Subject to any disclaimer, the term of this patent is extended or adjusted under 35 U.S.C. 154(b) by 0 days.

(21) Appl. No.: 09/442,348

(22) Filed: Nov. 17, 1999

(Under 37 CFR 1.47)

(51) Int. Cl.[7] ............................ G06K 9/00; G06K 9/34; G06K 9/62; H04N 5/04; H03L 7/00

(52) U.S. Cl. ....................... 382/168; 382/224; 382/162; 382/164; 382/218; 382/219; 348/500; 348/536; 348/537

(58) Field of Search ................................ 382/162, 164, 382/168, 169, 224, 225, 219, 274, 218; 348/536, 537; 345/328

(56) References Cited

U.S. PATENT DOCUMENTS

| | | | | | |
|---|---|---|---|---|---|
| 5,519,790 | A | | 5/1996 | Manning | 382/236 |
| 5,541,646 | A | | 7/1996 | Huang | 348/177 |
| 5,606,373 | A | | 2/1997 | Dopp et al. | 348/459 |
| 5,754,700 | A | | 5/1998 | Kuzma | 382/236 |
| 5,767,916 | A | * | 6/1998 | West | 348/537 |
| 5,875,262 | A | * | 2/1999 | Asada | 382/169 |
| 5,995,095 | A | * | 11/1999 | Ratakonda | 345/328 |
| 6,014,183 | A | | 1/2000 | Hoang | 348/702 |
| 6,055,018 | A | | 4/2000 | Swan | 348/448 |
| 6,104,831 | A | | 8/2000 | Ruland | 382/173 |
| 6,157,412 | A | | 12/2000 | Westerman et al. | 348/558 |
| 6,351,556 | B1 | * | 2/2002 | Loui et al. | 382/164 |
| 6,389,168 | B2 | * | 5/2002 | Altunbasak et al. | 382/224 |

FOREIGN PATENT DOCUMENTS

| | | | |
|---|---|---|---|
| GB | 2349031 | 10/2000 | H04N/5/14 |

* cited by examiner

*Primary Examiner*—Phuoc Tran
*Assistant Examiner*—Amir Alavi

(57) ABSTRACT

A method of reducing noise in a digitally sampled image in which entire frame images are sampled to form a histograms which are used to determine the relative noise level of the static image over a period of several frames. A frame of data is sampled using a pixel clock signal. A histogram of that frame is constructed which involves counting the number of occurrences of a value of color or range of colors in the image and storing that number. A second frame is sampled and a histogram is constructed for the second frame. A comparison is made between the two sets of histogram information. The difference gives the system controller a relative measure of the digital noise present in the static image. This process is repeated over time giving wherein each of the histograms shows a change. After a set number of steps are performed the pixel clock phase is set to correspond to the phase having the least change.

7 Claims, 3 Drawing Sheets

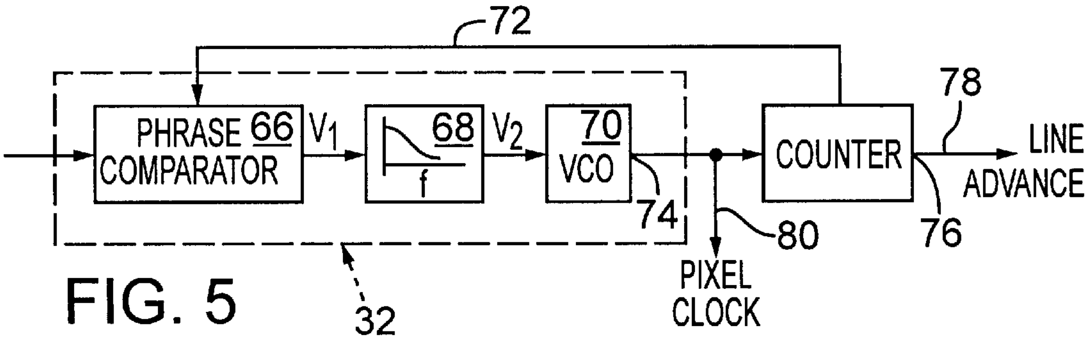
FIG. 5
COLUMNS / LINES
| LINES | 1 | 2 | 3 |
|---|---|---|---|
| 1 | 2 | 1 | 0 |
| 2 | 3 | 2 | 0 |
| 3 | 0 | 0 | 1 |
RED
FIG. 6
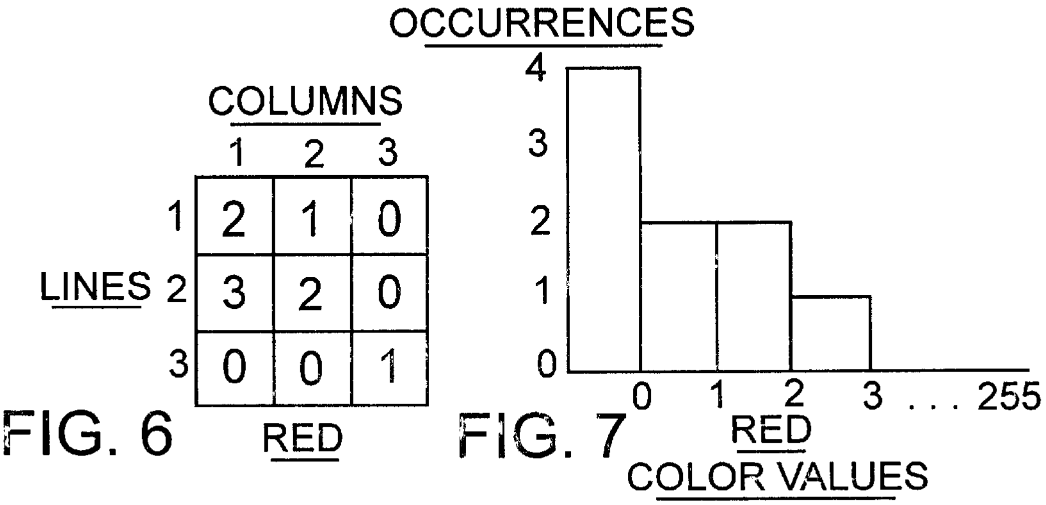
FIG. 7
COLUMNS / LINES
| LINES | 1 | 2 | 3 |
|---|---|---|---|
| 1 | 2 | 1 | 1 |
| 2 | 3 | 2 | 0 |
| 3 | 0 | 1 | 1 |
RED
FIG. 8
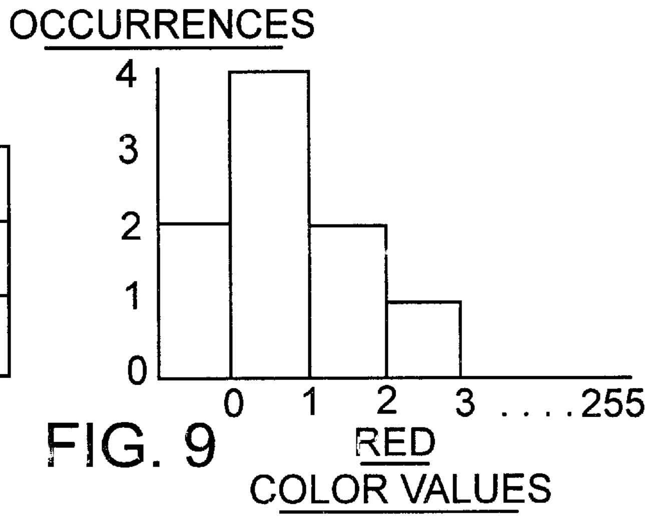
FIG. 9
FIG. 10
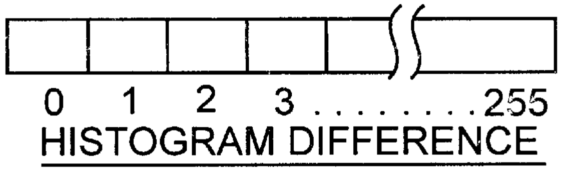

NOISE REDUCTION THROUGH COMPARATIVE HISTOGRAMS

TECHNICAL FIELD

This invention is directed to reducing noise in the conversion of an analog signal to a digital video signal by using histograms of sampled images to reduce the amount of noise over a period of time.

BACKGROUND OF THE INVENTION

It has become increasingly popular to use multimedia display systems to make presentations at business meetings, sales demonstrations, and classroom sessions. Most multimedia projection display systems receive analog video signals from a personal computer (PC). The video signals represent still, partial-, or full-motion display images of the type rendered by the PC. The analog video signals are converted into digital video signals to control a digitally-driven display object, such as a transmissive liquid crystal display (LCD) or a digital mirror device (DMD), to form the display images for projection onto a display screen.

Two common types of multimedia projection display systems are LCD projectors and LCD projection panels. An LCD projector includes a transmissive LCD, a light source, and projection optics to form and project display images in the manner described above. An LCD projection panel includes a similar transmissive LCD to form the display image, but operates with a conventional overhead projector (OHP) having a light source and projection optics, to project the display image onto a display screen. Examples of such LCD projectors and LCD projection panels are sold under the respective trademarks LITEPRO and PANELBOOK by In Focus Systems, Inc. of Wilsonville, Oreg., the assignee of the present invention.

One desirable feature for multimedia display systems is compatibility with the various analog video signal modes generated by various PC's. These modes generally range from 640×480 to 1600×1200 resolutions provided at image refresh rates of 60 to 100 Hz. The resolution expresses the number of horizontal and vertical pixel elements that can be turned on and off. Given the variety of resolution modes, multimedia display systems include an interface that converts analog video signals of various modes to digital video signals capable of controlling the LCD.

Analog video signals comprise an analog image data signal for each of the primary colors red, green and blue, and digital timing signals, which may include a pulsed horizontal synchronizing signal ($H_{sync}$) and a pulsed vertical synchronizing signal ($V_{sync}$), or a composite sync signal. The individual analog color signals are generated from bit data in a memory portion of the PC, using three digital-to-analog (D/A) converters, one for each of red, green, and blue. A complete image is typically displayed during a time interval known as a "frame period." Each video frame is usually produced to have a central active video region surrounded by an inactive ("blanked") margin. The resolution refers to only the pixels in the active video region. The state of each pixel, it's color or shade of gray, for example, is described by several bits of data. The exact number of bits depends upon the desired number of colors or gray levels. Because of the large number of pixels and multiple bits required to specify the optical state of each pixel, a large amount of image data is required to characterize the image of each frame. For example, a typical liquid crystal display may have 480 rows and 640 columns that intersect to form a matrix of 307,200 pixels.

Because the LCD used in multimedia display systems require digital video signals, either the LCD or the system normally has an analog to digital (A/D) signal converter for converting the PC-generated analog video signals into a digital format suitable for driving the LCD. The A/D signal converter is usually combined with a phase-locked loop (PLL), which may comprise a phase comparator, a low-pass loop filter, and a voltage-controlled oscillator (VCO) formed in a loop to generate a feedback signal that locks into $H_{sync}$. In order to generate a selected multiple n of clock pulses for each period of $H_{sync}$, a divide-by-n counter is added to the feedback loop between the VCO output and the phase comparator.

The number n of individual pixel pulses per $H_{sync}$ pulse may be set by reference to the resolution mode of the analog video source. To set the resolution mode, certain characteristics of the analog video signal, such as $H_{sync}$ and $V_{sync}$ may be used to refer to a mode look-up table stored in the display system CPU. The number n should be set to equal the number of pixel data components in each horizontal line of the scanned analog signal, including those active video data region and the blanked margin regions on either side of the active region. For example, for a screen resolution of 640×480, n may be set at about 800 to include the blanked regions on either side of the 640 pixel-wide active video data region. Thus, the pixel clock would sample the continuous stream of analog image data 800 times along each horizontal line of the frame.

FIG. 1 shows the desired relationship between the analog video data signal 1 and the pixel clock signal 4 is that the number n of pixel clocks 5 is set to establish a one-to-one relationship between pixel clock pulses 5 and pixel data components 2 of the analog data signal 1. This one-to-one relationship requires that the pixel clock signal frequency be equal to the analog video data signal frequency. Under this relationship, each pixel data component 2 of the analog signal is sampled by a single pixel clock pulse 5, which reads the instantaneous voltage value of the pixel data component so that it can be digitized. Since the pixel clock pulses 5 have "jitter" zones 6 at their leading and trailing edges, the clock pulses 5 should be registered with the centers of the pixel data components 2, so that the sampling is not randomly pushed by the jitter into the transition regions of the analog video signal. The stream of digitized values form the digital video data signal, which is addressed to the display object to appropriately set display object pixels at blank (black) or selected activated (non-black) status to replicate the image defined by the analog video signal.

Unfortunately, such A/D conversion is often imperfect due to errors in the pixel clock sampling of the analog signal. Such sampling imprecision gives rise to frequency (also known as "tracking") and "phase" errors, both of which may degrade the quality of the image.

Referring to the analog video signal 1 and pixel clock signal 4' in FIG. 2, tracking error results from the number n of pixel clocks being improperly set. As discussed above, the number n of pixel clocks should be equal to the number of pixel data components 2 of each horizontal line of analog video data signal. In FIG. 2, the improper setting of n results in the pixel data components 2 not being sampled at a consistent point. For instance, n is set too large in clock signal 4'. The resulting crowding of the pixel clock pulses 5' yields an additive leftward drift of the pixel clock pulses 5' relative to the pixel clock data components 2 of the analog video data signal 1. Such drift causes sampling in the transition regions 3. For instance, as indicated by positional bracket A, the leading edges 7' of the third through the sixth clock pulses 5' sample in transition zones 3 of the analog video signal 1. Accordingly, the transition zone data will be erroneous and the image information from adjacent non-sampled pixel data components 2 will be missing from the digitized video signal. If n is erroneously set large enough, the pixel clock pulses may be so crowded that individual analog pixel data components 2 may be double-sampled. On the other hand, if n is set too small, the dispersion of the pixel clock pulses results in a rightward drift wherein sampling may also occur in the transition regions. In all of these cases, the erroneous sampling provides erroneous video signal data that may degrade the image quality.

Phase error may occur even if the pixel clock signal frequency equals the analog video data signal frequency. As shown in pixel clock signal 4" in FIG. 3, the clock phase may be erroneously set such that every pixel clock pulse samples a transition region 3 of the analog video data signal. Leading edge jitter makes such phase error more likely, since if the jitter zones straddle the intersections 8 of the pixel data components 2 and transition regions 3 of the analog video data signal 1, the voltage will be randomly sampled on either side of the intersection 8. In any case, phase error is undesirable in generating undesirable noise, or "snow" in the video image.

A current system for a projection display system is connected to a multimedia source of the PC type. The projection display system may include an image capture circuit that automatically eliminates phase and tracking error. A microcontroller, which is part of a display system CPU, controls the image capture circuit. The image capture circuit includes a programmable delay device, a PLL, a divide-by-n-counter, an A/D converter, and an ASIC (Application Specific Integrated Circuit) that contains an image edge detection circuit. The microcontroller controls the delay device and the counter to eliminate phase and tracking errors. A display object is connected to the output of the A/D converter. A window random access memory (WRAM) is connected between the ASIC and the display object.

The A/D converter samples (reads) the instantaneous voltage value of the analog video data signal at the leading edge of each of the pixel clocks, thereby generating a series of sampled data signal values. The A/D converter then quantizes the sampled values by matching each value to one of a series of preselected voltage amplitude levels, which have corresponding numerical values. These numerical values are then represented digitally and coded to establish 8-bit data for each of the colors red, green and blue. The three eight-bit color data signals are input through the three respective color data signal channels to the ASIC. At the display object, the coded color data signal set pixels at blank (black) or specific activated (non-black) status corresponding to the sampled voltage level.

The digital video data signals output from the image capture circuit are manipulated by the WRAM and display object control module to appropriately control the display object. Each frame is addressed to the WRAM where the frames are stored until they are addressed to the display object. Typically, the frames are addressed to the WRAM at a faster rate than they are addressed to the display object. For example, each frame may be addressed to the WRAM at 80 Hz and addressed to the display object at 60 Hz. Therefore, the WRAM must include enough capacity or memory to store a number of frames at once.

Such current systems are not optimum due to the fact that every pixel of each frame must be held within the WRAM for comparison with pixels of consecutive frames. The WRAM is expensive and adds to the cost of the projection system because of its necessary large storage capacity. Additionally, the WRAM takes up a large amount of board space.

SUMMARY OF THE INVENTION

It is an object of the present invention to reduce noise in a digitally sampled image without the use of an expensive frame memory to store the entire frame image.

Another object of the invention is to reduce noise in a digitally sampled image by using a histogram of a sampled image to reduce the relative noise level of a static image over a time period of several frames.

Another object of the invention is to compare histograms of consecutive frames of data to determine the relative measure of digital noise present in a static image.

In accordance with a preferred method of the present invention, a digital video signal is produced from an analog video signal including an analog video data signal that is operable to be raster scanned in lines across a CRT screen to form consecutive frames of video information. The raster scanning is controlled by use of a horizontal synchronizing signal ($H_{sync}$) that controls a line scan rate and a vertical synchronizing signal ($V_{sync}$) that controls a frame refresh rate to produce consecutive frames of video information. The digital video signal is produced by generating a pixel clock signal with pixel clocks for repetitively sampling instantaneous values of the analog video data signal and digitizing the active image width of the analog video data signal based on the pixel clock sampling.

A frame of data is sampled using a pixel clock signal. A histogram of that frame is constructed by counting the number of occurrences of a value of color or range of colors in the frame and storing the number. A second frame is sampled and a histogram is constructed for the second frame. A comparison is made between the histogram of the first frame and the histogram of the second frame. The difference in the number of color value changes between the first and second histograms gives the system controller a relative measure of the digital noise present in the static image of that phase setting. The pixel clock phase is then shifted and histograms of the first and second frames of that phase are constructed and compared to each other to determine the difference in the number of color value changes in that phase. The process of constructing and comparing histograms of the first and second frames for each phase is repeated over time. After the set number of comparisons are performed the pixel clock phase is adjusted to correspond to phase of having the least change of color values.

In accordance to other aspects of the present invention, apparatus are provided for carrying out the above and other methods.

Additional objects and advantages of this invention will be apparent from the following detailed description of preferred embodiments thereof which proceeds with reference to the accompanying drawings.

BRIEF DESCRIPTION OF THE DRAWINGS

FIG. 5 is a schematic view of a phase-locked-loop (PLL) circuit used in analog video signal capture according to an aspect of the invention.

FIG. 6 is a diagrammatic representation of several lines and columns of a first video image frame during a first phase showing the pixel values for the color red.

FIG. 7 is a graphical representation of a histogram for the portion of the video image frame represented in FIG. 6.

FIG. 8 is a diagrammatic representation of several lines and columns of a second video image frame during a first phase showing the pixel values for the color red.

FIG. 9 is a graphical representation of a histogram for the portion of the video image frame represented in FIG. 8.

FIG. 10 is a diagrammatic representation showing the difference between the histogram of FIG. 7 and FIG. 9.

DETAILED DESCRIPTION OF PREFERRED EMBODIMENT

Figure 1:
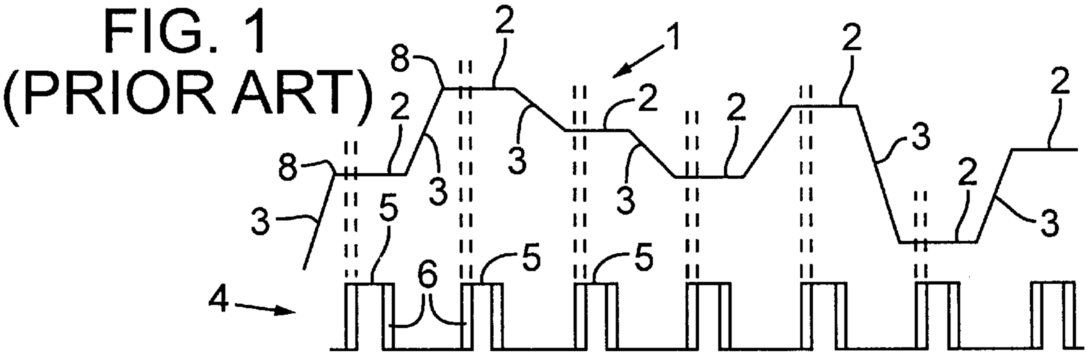
FIG. 1 (PRIOR ART)
FIG. 1 depicts an analog video data signal waveform and a pixel clock signal waveform in a desired relationship where no tracking or phase error would result.
Figure 2:
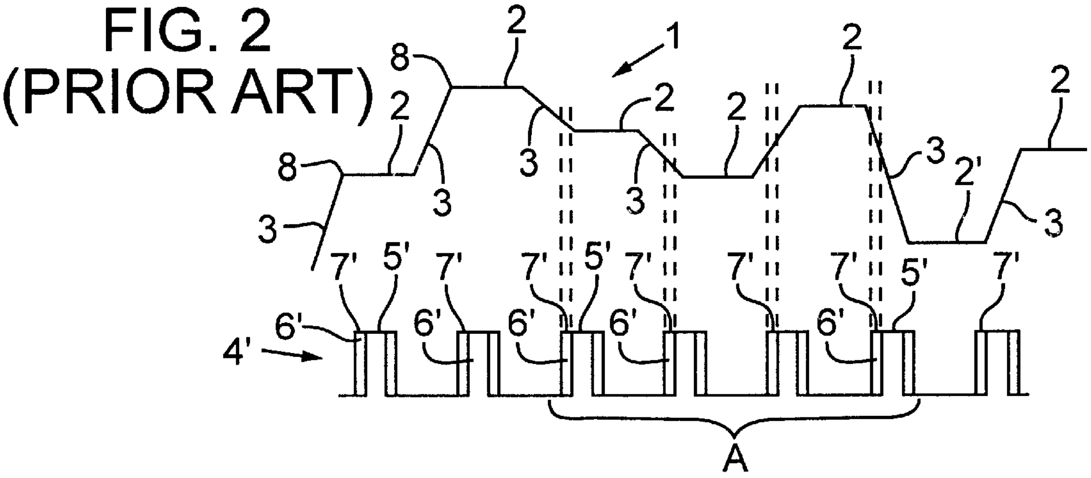
FIG. 2 (PRIOR ART)
FIG. 2 depicts an analog video data signal waveform and a pixel clock signal waveform in a relationship where tracking error would result.
Figure 3:
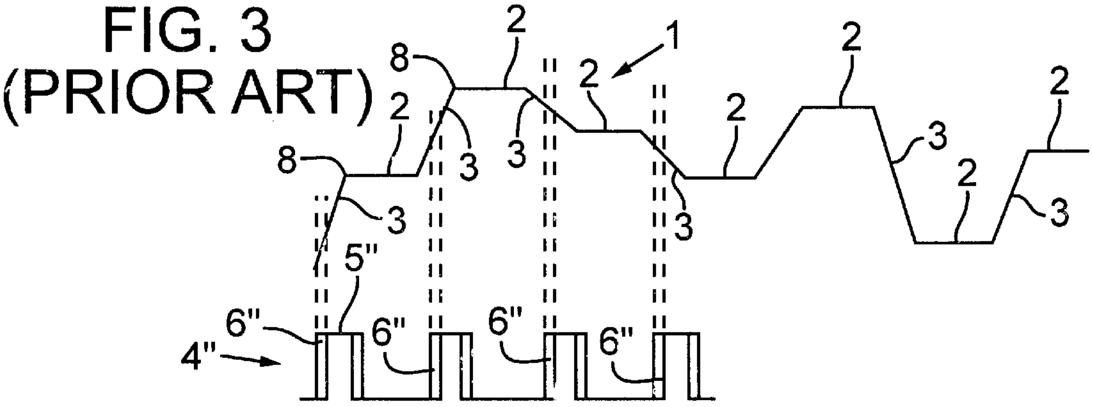
FIG. 3 (PRIOR ART)
FIG. 3 depicts an analog video data signal waveform and a pixel clock signal waveform in a relationship where phase error would result.
Figure 4:
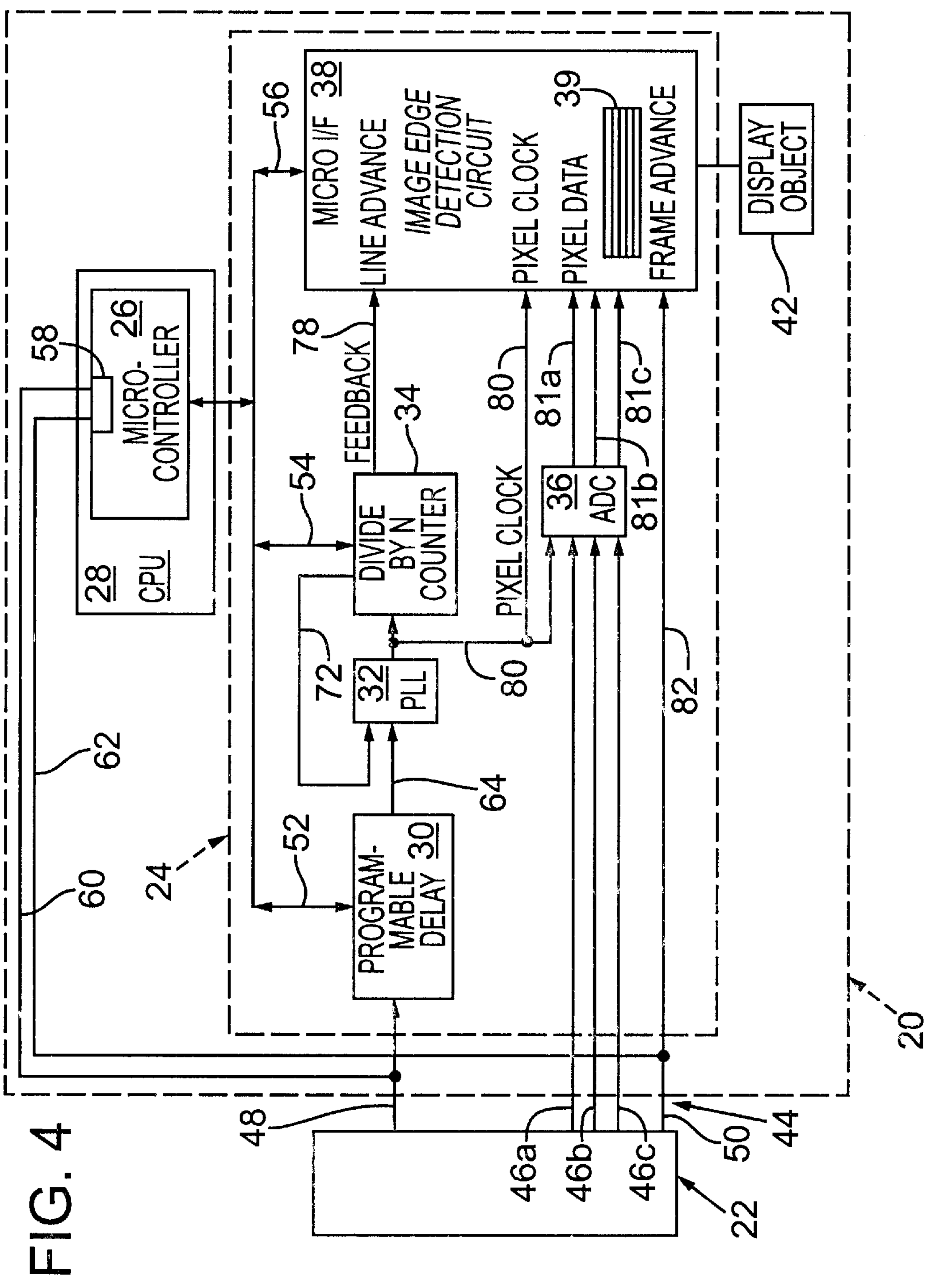
FIG. 4 is an overall schematic view of multimedia source connected to a multimedia projection display system, and depicting an analog video signal capture circuit in accordance with an aspect of the invention.

A schematic illustration of the present invention is seen in FIG. 4 which shows a projection display system 20 connected to a multimedia source 22 such as a PC. The projection display system 20 includes an image capture circuit 24 that automatically eliminates phase and tracking error. A microcontroller 26, which is part of a display system CPU 28, controls the image capture circuit 24. The image capture circuit 24 includes a programmable delay device 30, a PLL 32, a divide-by-n-counter (counter) 34, an A/D converter 36, and an ASIC (Application Specific Integrated Circuit) 38. The ASIC 38 may contain a pixel data comparator, a counter, a threshold value register, and a histogram register 39 to perform the algorithm discussed below. The microcontroller 26 executes a firmware program that runs the ASIC 38 and controls the delay device 30 and the counter 34 based on the output of the ASIC 38 to eliminate phase and tracking errors. A display object 42 is connected to the output of the ASIC 38.

The multimedia source PC 22 is connected to the projection display system 20 through a video source cable 44 shown in exploded schematic form. The cable 44 is of conventional design and includes multiple distinct conductors that are shielded together, including three separate channels 46*a*, 46*b*, 46*c* for carrying analog signals corresponding to red, green, and blue (RGB) color video components, and two conductors 48, 50 carrying the $H_{sync}$ and $V_{sync}$ signals, respectively.

Turning to the details of the image capture circuit 24, the microcontroller 26 is connected to the delay device 30 by a bus 52, to the counter 34 by a bus 54, and to the ASIC 38 by a bus 56. A mode identification counter 58, which is connected to $H_{sync}$ and $V_{sync}$ through conductors 60 and 62, respectively, may be located in the microcontroller 26 or the ASIC 38. The mode identification counter 58 may also be provided independent of the microcontroller. A preferred microcontroller 26 is model MC6833 1, made by Motorola. The delay device 30 has an input connected to the $H_{sync}$ conductor 60, and an output connected to the PLL 32 through conductor 64. The preferred delay device is model No. DS10205-25, made by the Dallas Corporation.

As shown in detail in FIG. 5, the PLL 32 is of conventional design and includes a phase comparator 66, a low-pass filter 68, and a VCO pixel clock signal generator 70. A feedback loop 72 provided with the counter 34 connects the VCO output 74 and the phase comparator 66. The counter output 76 is connected to the ASIC 38 through a conductor 78, and the VCO output 74 is connected to the ASIC 38 and the A/D converter 36 through conductor 80. The preferred PLL is model ICS 1522 made by ICS. The counter 34 is preferably a part of the ASIC 38.

Referring now to FIG. 4, the three analog video data signal channels 46*a*, 46*b*, 46*c* are connected to the A/D converter input. The A/D converter 36 includes three separate conventional A/D converters for digitizing each of the red, green and blue analog video data signals. Three color data signal channels 81*a*, 81*b*, 81*c* connect the A/D converter output to the ASIC. A preferred A/D converter is model 9542A made by the Raytheon Corporation. The $V_{sync}$ signal output of the PC source 22 is connected to the ASIC 38 through a frame advance conductor 82.

In operation, the analog video signal is digitized in a manner set forth and described in U.S. Pat. No. 5,767,916. The display system 20 determines the resolution mode by a firmware program that uses the mode identification counter 58. $H_{sync}$ is input through conductor 60 to the mode identification counter 58 and the number of 50 MHz counter clocks over twenty $H_{sync}$ pulses is counted. In this way, an average number of clocks per line is obtained. $V_{sync}$ is input through conductor 62 into the mode identification counter 58 and the number of lines for each $V_{sync}$ pulse is obtained. The firmware then accesses a look-up table that determines resolution based on the number of 50 MHz clocks per twenty lines, and number of lines per frame.

Digitization of the analog video data signals occurs based on the number n of pixel clocks per line. The PLL 32 generates the pixel clock signal and the microcontroller 26 sets the counter 34 to generate a feedback pulse (i.e. line advance signal) once every n pixel clocks. Once n is selected, the PLL 32 automatically adjusts to produce a line advance signal frequency corresponding to $H_{sync}$, and a pixel clock signal having a frequency of n times the line advance frequency.

The PLL 32 works by the phase comparator 66 receiving the $H_{sync}$ signal from the delay device 30 through conductor 64 and receiving the feedback pulse signal through the feedback loop 72. The phase comparator 66 compares the frequencies of the $H_{sync}$ and the feedback pulse signal, generating an output voltage that is a measure of their phase difference. If the feedback pulse frequency does not equal the $H_{sync}$ frequency, the phase difference signal causes the VCO pixel clock frequency to deviate so that the feedback pulse frequency of the counter 34 deviates toward the $H_{sync}$ frequency.

The feedback pulse signal (line advance signal) of the counter 34 is directed to the ASIC 38 and the A/D converter 36 through conductor 80. The line advance signal and $V_{sync}$ are conditioned to be one clock pulse in duration through the use of a pulse edge detection circuit or the like.

The A/D converter 36 samples (reads) the instantaneous voltage value of the analog video data signal at the leading edge of each of the pixel clocks thereby generating a series of sampled data signal values. The A/D converter then quantifies the sampled values by matching each value to one of a series of preselected voltage amplitude levels, which have corresponding numerical values. These numerical values are then represented digitally and coded to establish 8-bit data for each of the colors red, green, and blue. The three eight-bit color data signals are input through the three respective color data signal channels 56*a,* 56*b,* 56*c* to the edge detection circuit 40. At the display object 42, the coded color data signal set pixels at blank (black) or specific activated (non-black) status corresponding to the sampled voltage value.

The $V_{sync}$ signal generates a first frame that is scanned by generating a pixel clock signal to determine the number of occurrences of a value for each of the colors red, green, and blue of each pixel. A histogram is constructed for that frame and stored in the histogram register 39. The $V_{sync}$ signal generates a second frame that is then scanned in the same manner to determine the number of occurrences of the value for each of the colors red, green, and blue of each pixel in the second frame. A histogram is constructed for the second frame and stored in the histogram register 39. The ASIC 38 then compares the histograms of the first and second frames and determines the difference between the number of occurrences of the color values in the first frame and the number of occurrences of the color values in the second frame. The pixel clock is then shifted and the process repeated a number of times to determine which phase has the least difference between the number of occurrences of color values in the two frames. The pixel clock is then adjusted to that phase producing an image in which the digital noise is substantially reduced. The pixel clock may be shifted any number of times; however, it has been determined that shifting the pixel clock over twenty phases is adequate to determine the correct phase to which the pixel clock should be adjusted.

This process is best seen in FIGS. 6–10 which show a simplified construction and comparison of histograms. Histograms are constructed for each of the colors red, green, and blue with each color having approximately 255 shades or values. However, for simplicity FIGS. 6–10 show histogram construction and comparison for only a few values of one color, such as, for example, red. Furthermore, FIG. 6 represents only the first few lines and columns of a frame. It is to be understood that an illustration of an entire frame would show many more lines and columns. For example, a representation of a frame having a resolution of 1024×768 would have 768 lines and 1024 columns. For simplicity, only the first few lines and columns of the frame are shown.

The frame is produced by the $V_{sync}$ signal and is scanned by generating a pixel clock signal. FIG. 6 shows examples of the numerical values for the color red in the first few lines and columns of the frame where the red value for the pixel in line 1, column 1 is 2, the red value for the pixel in line 1, column 2 is 1, and the red value for the pixel in line 1, column 3 is 0. FIG. 7 is a graph in which the color value is plotted against the number of occurrences of that color value to form the histogram of the portion of the frame represented in FIG. 6.

The $V_{sync}$ generates a second frame partially represented in FIG. 8 which shows the red color values for the pixels some of which may be different than the previous frame. For example, the pixel in line 1, column 1 of FIG. 8 has a value of 2, the pixel in line 1, column 2 has a value of 1, and the pixel in line 1, column 3 has a value of 1. In FIG. 9, these values are plotted against the number of occurrences of those values to form the histogram of the portion of the second frame represented in FIG. 8. It should be understood that the histograms of FIGS. 7 and 9 include only the first few color values out of a total of about 255.

The histograms of the first and second frames are then compared in the ASIC 38 and the difference is represented in FIG. 10. The difference between the histograms can be determined in a number of ways. One way is to perform a simple subtraction. For example, as seen in FIG. 7 there are four occurrences of the red color value 0 in the portion of the first frame of FIG. 6. FIG. 9 shows two occurrences of the red color value 0 in the portion of the second frame seen in FIG. 8. Therefore, the difference between the number of occurrences of the red color value 0 in the first and second frames is 2. The subtraction is performed for each color value and the difference is stored in a register in the ASIC 38.

The pixel clock is then shifted to begin a new phase in which a frame is generated and scanned and a histogram of that frame is constructed in the manner discussed above. The $V_{sync}$ signal generates a second frame during this phase and a histogram of the second frame is constructed and compared to the histogram of the first frame in the same phase with the difference between the histograms being determined and saved in a register in the ASIC 38.

The pixel clock is again shifted and the process repeated a number of times to determine which phase has the least difference between the histograms of the first and second frames. It has been determined that twenty phases are adequate. The pixel clock is then adjusted to the phase having the least difference between the histograms of the first and second frames and the algorithm is complete.

It will be obvious to those having skill in the art that many changes may be made to the details of the above-described embodiment of this invention without departing from the underlying principles thereof. The scope of the present invention should, therefore, be determined only by the following claims.

What is claimed is:

1. A method of reducing noise in a digitally sampled image wherein an analog signal produces frames of image data with each frame being made up of a plurality of lines of pixel components having a numerical value assigned for each pixel value, the method comprising the steps of:

generating a pixel clock signal having a first phase for digitizing a pair of frames of the image data;

scanning the numerical values assigned to the pixels in the digitized pair of frames;

constructing a histogram of the numerical values for each of the digitized pair of frames;

comparing the histograms of the pair of frames to determine a difference between a number of occurrences of each numerical value in the pair of frames, the difference representing a relative measure of the noise present in the digitized pair of frames;

shifting the phase of the pixel clock to at least a second phase;

repeating the generating, scanning, constructing, and comparing steps for at least the second phase of the pixel clock;

determining which phase of the pixel clock causes a least difference between the number of occurrences of each numerical value in the pair of frames; and adjusting the pixel clock phase to the phase causing a least difference between the number of occurrences of the numerical values in the pair of frames, the least difference representing a least amount of noise present in the digitized pair of frames.

2. The method of claim 1, in which the shifting and repeating steps are carried out less than about 20 times.

3. The method of claim 1, in which the pair of frames includes a same pair of frames of image data for each phase of the pixel clock.

4. The method of claim 1, in which the pair of frames includes consecutive frames of image data.

5. The method of claim 1, in which the shifting is carried out automatically and iteratively.

6. The method of claim 1, in which the pair of frames include substantially identical image data.

7. The method of claim 1, in which the numerical value includes a color value.

* * * * *